US006882750B2

United States Patent
Suzuki

(10) Patent No.: US 6,882,750 B2
(45) Date of Patent: Apr. 19, 2005

(54) FAST LOSS LESS IMAGE COMPRESSION SYSTEM BASED ON NEIGHBORHOOD COMPARISONS

(75) Inventor: Norihisa Suzuki, Los Altos Hills, CA (US)

(73) Assignee: Zaxel Systems, Inc., Los Altos, CA (US)

( * ) Notice: Subject to any disclaimer, the term of this patent is extended or adjusted under 35 U.S.C. 154(b) by 77 days.

(21) Appl. No.: 10/446,506

(22) Filed: May 27, 2003

(65) Prior Publication Data

US 2004/0008896 A1 Jan. 15, 2004

Related U.S. Application Data

(63) Continuation-in-part of application No. 09/562,784, filed on May 2, 2000.

(51) Int. Cl.[7] .............................................. G06K 9/36
(52) U.S. Cl. ...................................... 382/246; 382/232
(58) Field of Search ................................ 382/232–233, 382/236, 239, 244, 246; 341/51, 67; 375/240.02

(56) References Cited

U.S. PATENT DOCUMENTS

| | | | | |
|---|---|---|---|---|
| 4,816,914 A | * | 3/1989 | Ericsson ................ | 375/240.03 |
| 5,057,917 A | * | 10/1991 | Shalkauser et al. .... | 375/240.12 |
| 5,095,374 A | * | 3/1992 | Klein et al. ................. | 382/246 |
| 5,710,909 A | * | 1/1998 | Brown et al. ............... | 711/170 |
| 5,883,976 A | * | 3/1999 | Ohsawa ...................... | 382/232 |
| 6,008,847 A | * | 12/1999 | Bauchspies ............ | 375/240.01 |
| 6,016,163 A | * | 1/2000 | Rodriguez et al. ..... | 375/240.24 |
| 6,075,470 A | * | 6/2000 | Little et al. ................. | 341/107 |

OTHER PUBLICATIONS

Abrahams "Code and parse trees for lossless source coding", IEEE, pp. 145–171, 1998.*
Huang, et al. "Windowed Huffman coding algorithm with size adaption", IEE Proceedings, pp. 109–113, 1993.*
Wang, et al. "Best–Neighborhood Matching: an information loss restoration technique for block based image coding systems", IEEE, pp. 1056–1061, 1998.*
Liu, et al. "Design and hardware architectures for dynamic Huffman coding", Iee Proceedings, pp. 411–418, 1995.*

* cited by examiner

*Primary Examiner*—Daniel Miriam
(74) *Attorney, Agent, or Firm*—Glenn Patent Group; Michael A. Glenn

(57) ABSTRACT

A fast loss less image compression system based on neighborhood comparisons compares pixel value differences with neighboring pixels and replaces such pixel values with the minimum of the differences. A marker is attached to a block of pixels, such that all the pixels in that block are compared with neighbors of one direction. The marker indicates how all of the pixels in that block are compared. Intermittent Huffman-tree construction is used such that one tree is used for several frames. Huffman coding is used to compress the resulting frame. A single Huffman-tree is constructed once every predetermined number of frames. The frequency of Huffman-tree construction can be performed according to the instantaneous availability of processor time to perform the construction. When more processing time is available, the Huffman-trees are computed more frequently. Such frequency variation can be implemented by using an input video frame buffer. If the buffer is a certain size, then processor time for Huffman-tree construction is available.

16 Claims, 8 Drawing Sheets

FAST LOSS LESS IMAGE COMPRESSION SYSTEM BASED ON NEIGHBORHOOD COMPARISONS

CROSS REFERENCE TO RELATED APPLICATIONS

This application is a Continuation-in-part of U.S. patent application Ser. No. 09/562,784, filed on 2 May 2000.

BACKGROUND OF THE INVENTION

1. Technical Field

The invention relates to data compression methods in a computer environment. More particularly, the invention relates to real-time fast loss-less video compression and decompression using video frame preprocessing.

2. Description of the Prior Art

Video data is typically encoded in large blocks of memory. Even a single video frame of, for example, a size of 1K×1K can require megabytes to describe it. Video data requires large amounts of memory to store and high communication bandwidths to transfer. It therefore is highly advantageous to compress video data. However, some compression methods lose information in the process.

Some applications can tolerate various degrees of loss, but still others require loss-less compression.

The typical loss-less video data compression methods use differential pulse code modulation (DPCM). A current pixel value is replaced by the difference between it and the previous pixel. Since pixel values change rather slowly along scan lines, the difference values will near zero, making compression algorithms particularly effective. However, many times, the slow change between pixel values occurs in vertical or diagonal bands. Prior art methods that can only take advantage of horizontal bands in the image are compromised.

Huffman coding can be used to compress real-time video data. A Huffman-tree is built and the tree is used to recode the data. The basic idea is that frequently occurring video codes are replaced by a Huffman code that requires fewer bits. Occasional video codes that occur infrequently are described with Huffman codes that require more bits than the video code itself. In spite of this, the combination of Huffman codes does result in an overall gain in compression.

A conventional approach is to compute the Huffman-tree once. This is regardless of any real difference resulting from the previous tree and regardless of available processing time to handle the job at that instant. The computational time required to compute the Huffman-tree can equal that needed to run the compression for one image with that tree.

It would be advantageous to provide a fast loss less image compression system based on neighborhood comparisons that provides fast pre-processing of images. It would further be advantageous to provide a fast loss less image compression system based on neighborhood comparisons that speeds up Huffman coding and the compression of video images.

SUMMARY OF THE INVENTION

The invention provides a fast loss less image compression system based on neighborhood comparisons. The invention provides fast pre-processing of images. In addition, the invention provides faster Huffman coding and video image compression.

A preferred embodiment of the invention preprocesses video frames in a video stream using a best-neighbor algorithm that compares pixel value differences with neighboring pixels and replaces the pixel values with the smallest differences. This reduces the variance of image frame values for better compression.

A marker is attached to an n-by-m block of pixels, such that all the pixels in that block are compared with neighboring pixels of one direction. The marker indicates how all the pixels in that block are compared.

Huffman coding is used to compress the resulting frame. Intermittent Huffman code tree construction is used by the invention to provide more efficient use of CPU resources. A single Huffman-tree is constructed once every predetermined number of frames and used to compress a set of frames. When used for real-time video compression, the frequency of Huffman-tree construction is selected according to the instantaneous availability of processor time to perform the construction.

When more processing time is available, the Huffman trees are computed more frequently. The frequency variation is implemented by checking an input video frame buffer for video frames to be compressed. If the size of the frame buffer is a predetermined value, then processor time for constructing a Huffman tree is available.

Other aspects and advantages of the invention will become apparent from the following detailed description in combination with the accompanying drawings, illustrating, by way of example, the principles of the invention.

DETAILED DESCRIPTION OF THE INVENTION

The invention is embodied in a fast loss less image compression system based on neighborhood comparisons. A system according to the invention provides fast preprocessing of images. The invention additionally provides faster Huffman coding and video image compression.

In order for the compression and decompression of video frames to work in real-time, not only must the compression and decompression be fast, but there will be no preprocessing time for the input video. The compression and decompression for video frames have to finish in a bounded amount of time.

A preferred embodiment of the invention provides the fast preprocessing of video images (frames) to reduce the variance of image frame values for better compression. The video frames that are preprocessed are compressed using Huffman coding. Huffman coding requires a large amount of computation time, so the invention speeds up the Huffman coding. The invention also selectively compresses frames if the available computation capacity cannot keep up with the video data to be compressed.

Figure 1:
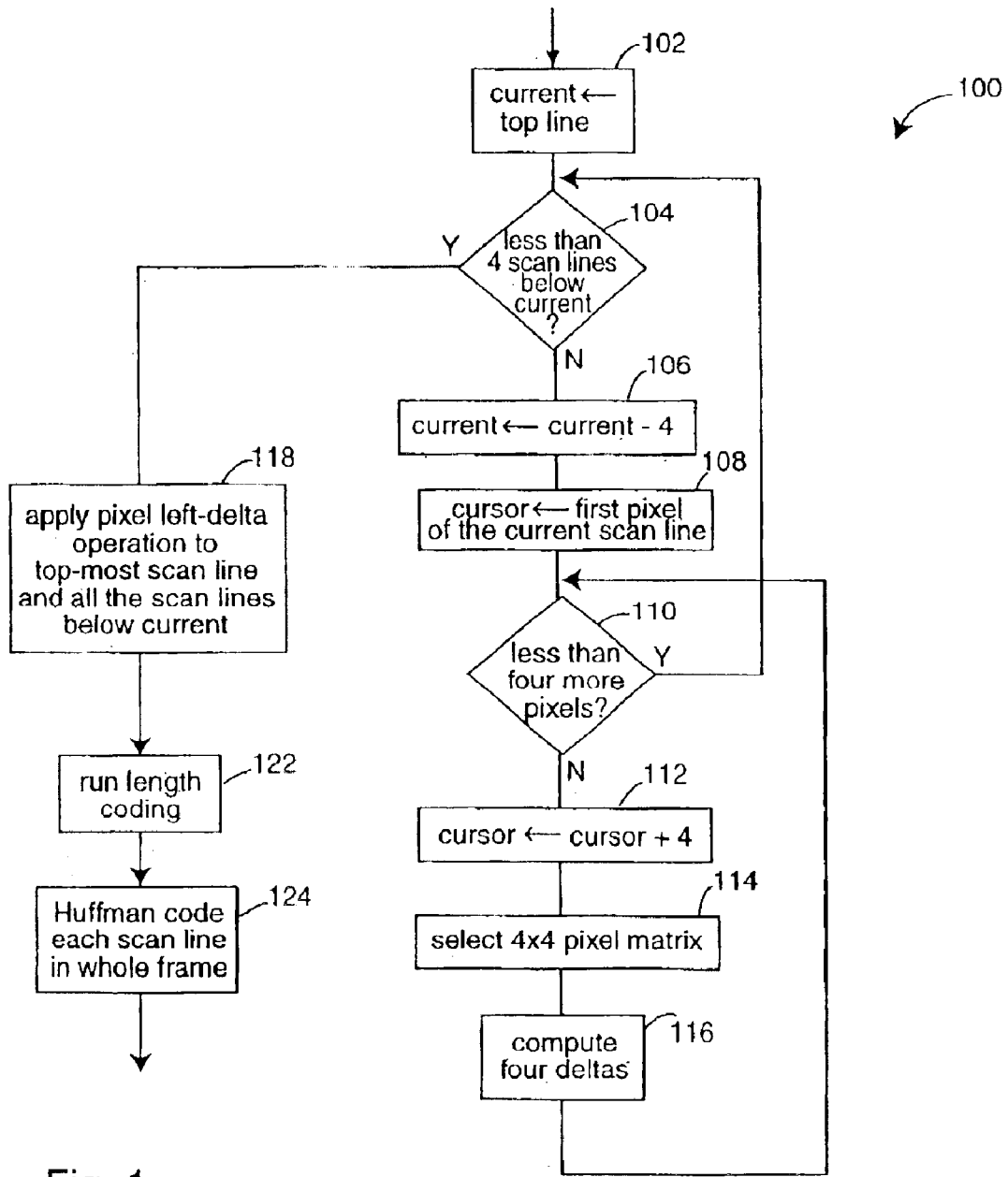
FIG. 1 is a flowchart of a video data compression embodiment of the present invention that uses four delta computations for improved performance where the image has horizontal, vertical, and/or diagonal bands.

FIG. 1 represents a fast preprocessing best-neighbor compression method embodiment of the present invention, and is referred to herein by the general reference numeral 100. One skilled in the art will readily appreciate that, although the text below use a block of size four by four as an example, the invention can be generalized to a block of n by m, for any number n which is smaller than the number of scan lines, and m which is smaller than the number of pixels in one scan line.

A typical video stream for compression by method 100 comprises a series of video frames, each video frame comprises a number of scan lines, and each scan line includes a number of pixels. The method 100 comprises a step 102 that sets a current-scan-line address counter to the top scan line of a frame. A step 104 checks if there are less than four (n) scan lines left below the current scan line. If not, a step 106 lowers the current-scan-line address counter by four (n).

A step 108 sets a cursor address counter to the first, or left-most pixel of the current scan line. A step 110 checks to see if there are less than four (m) pixels to the right of the cursor. If so, control returns to step 104. Otherwise, a step 112 advances the cursor address counter to the right by four (m). A step 114 selects, for example, a four-by-four (n-by-m) pixel matrix with a cursor pixel at a bottom-right corner.

A step 116 computes four pixel-differential (delta) values for the selected pixel matrix, i.e., left delta, left-above delta, above delta, and right-above delta. An evaluation measure is computed for each delta matrix resulting from four delta operations. The delta matrix with the best (lowest) evaluation measure is selected. One marker is added to indicate which delta matrix was selected. The original matrix is replaced with the selected delta matrix and its marker. Huffman coding is applied to the marker.

A step 118 applies pixel left-delta computation to the remaining scan lines below current and top most scan line. Pixel left-delta computation replaces the pixel values of the entire scan line except the left most pixel. Each pixel is replaced by the difference between the value of that pixel and the original value of the immediately left neighbor pixel. A step 122 applies run-length coding. For example, if there is a sequential series of the same number in the pixel values such as: 0,0,0,0,1,1,1,1,2,2,2,2. This will be coded as a series of tuples: (4,0), (4,1), (4,2), where the first integer indicates the number of times the second integer is duplicated. A step 124 then Huffman codes each pixel of the whole resultant frame.

In method embodiments of the present invention, a left delta operation returns a four-by-four (n-by-m) matrix with pixel values computed from the original matrix. For each pixel in the original matrix, a difference is calculated between a current pixel value and a left neighbor pixel value.

A left-above delta operation returns a four-by-four (n-by-m) matrix with pixel values computed from the original matrix. For each pixel in an original matrix, a difference is calculated between a current pixel value and a diagonally left and above neighbor pixel value.

An above delta operation returns a four-by-four (n-by-m) matrix with pixel values computed from the original matrix. For each pixel in the original matrix, a difference is calculated between a current pixel value and an above-neighbor pixel value.

A right-above delta operation returns a four-by-four (n-by-m) matrix with pixel values computed from the original matrix. For each pixel in the original matrix, a difference is calculated between a current pixel value and the diagonally right and above neighbor pixel value.

The Huffman coding comprises Huffman tree building and encoding based on the Huffman tree. The Huffman tree building takes a substantial amount of time. If a Huffman tree is created for every image frame, the computation time would be too long and the algorithm would not run in real time. Compression techniques such as MPEG, use Huffman coding but use one Huffman tree for the entire video. This is not satisfactory in many cases since the compression ratio deteriorates.

The invention creates the Huffman tree periodically. One approach creates the Huffman tree once every fixed number of frames. The frequency of the tree generation is computed so that the computation time for tree generation per frame is about one tenth of the encoding time.

Another approach is an adaptive approach. If the computer is fast and a lot of cycles are left, then the Huffman tree generation is run more frequently to get a better compression ratio. The invention approaches this problem by looking at the input buffer. Whenever the input buffer becomes empty or near empty, that means the compression system is catching up with the video input and, therefore, processing time is left over to do other things, such as tree generation. The invention's algorithm looks at the input buffer size and if the size falls below a threshold, then the Huffman tree generation is invoked.

Figure 2:
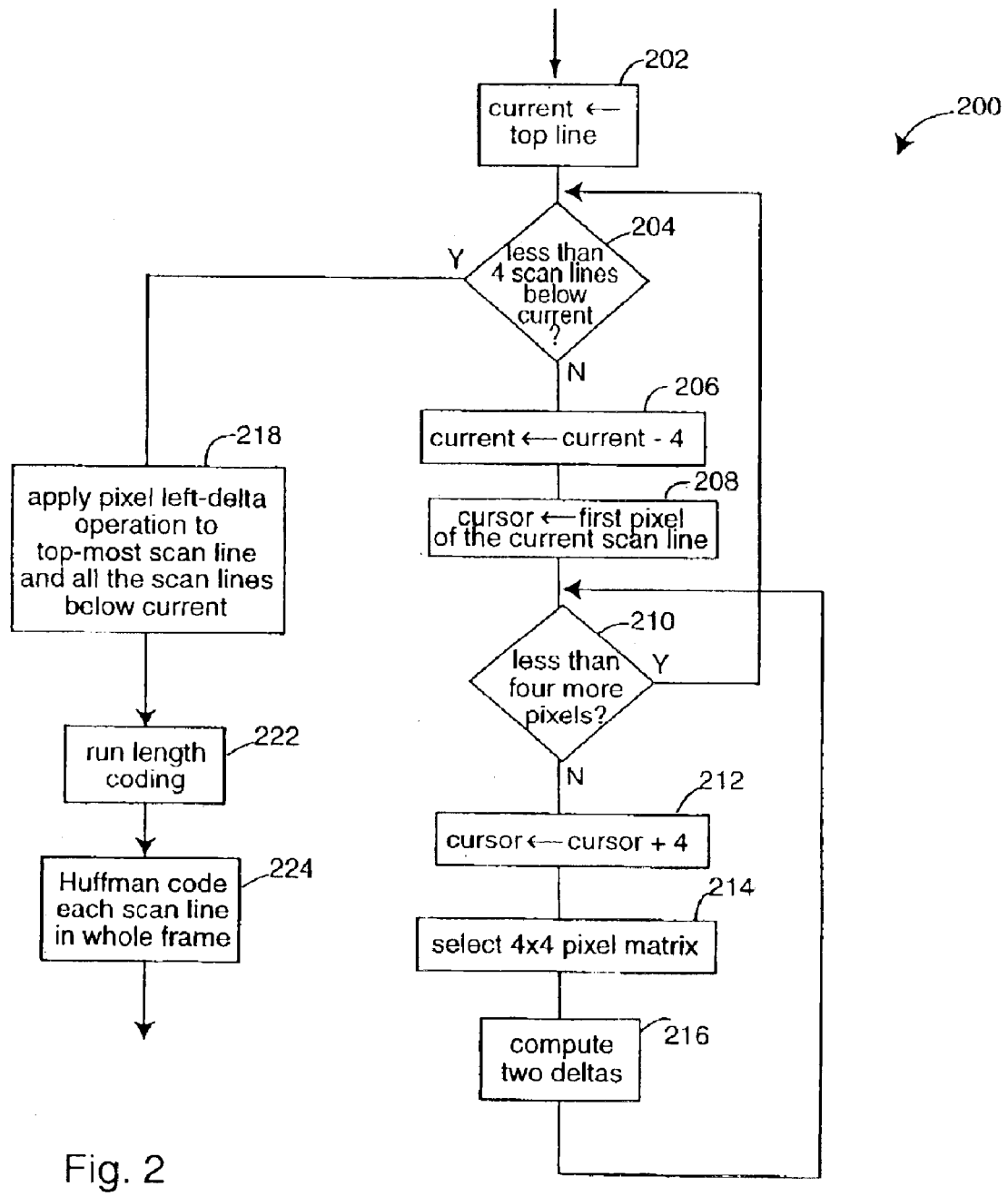
FIG. 2 is a flowchart of a video data compression embodiment of the present invention that uses two delta computations for improved performance where the image has horizontal and/or vertical bands.

FIG. 2 represents a simple fast preprocessing best-neighbor compression method embodiment of the invention, and is referred to herein by the general reference numeral 200. Method 200 is similar to method 100, but it only computes the left-delta and above-delta.

A typical video stream for compression by method 200 comprises a series of video frames, each video frame comprises a number of scan lines, and each scan line includes a number of pixels. The method 200 comprises a step 202 that sets a current-scan-line address counter to the top scan line of a frame. A step 204 checks if there are less than four (n) scan lines left below the current scan line. If not, a step 206 lowers the current-scan-line address counter by four (n).

A step 208 sets a cursor address counter to the first, or left-most pixel of the current scan line. A step 210 checks to see if there are less than four (m) pixels to the right of the cursor. If so, control returns to step 204. Otherwise, a step 212 advances the cursor address counter to the right by four (m). A step 214 selects, for example, a four-by-four (n-by-m) pixel matrix with a cursor pixel at a bottom-right corner.

A step 216 computes two pixel-differential (delta) values for the selected pixel matrix, i.e., left delta and above delta.

An evaluation measure is computed for each delta matrix resulting from the two delta operations. The delta matrix with the best (lowest) evaluation measure is selected. One marker is added to indicate which delta matrix was selected. The original matrix is replaced with the selected delta matrix and its marker. Huffman coding is then applied to the marker.

A step 218 applies pixel left-delta computation to the remaining scan lines below current and top most scan line. A step 222 applies run-length coding. A step 224 Huffman codes each scan line of the whole frame.

The evaluation measures mentioned for steps 116 and 216 are preferably equal to the sum of the absolute values of the all the pixels in a four-by-four (n-by-m) resulting delta matrix. If some pixel value differences cannot be computed because the pixel is at the edge of a frame, the evaluation value does not exist or is indicated. Consider the compression example represented in Table I.

TABLE I

Compression Example

| 15 | 16 | 19 | 13 | 8 | 9 | 12 | 14 |
|---|---|---|---|---|---|---|---|
| 14 | 18 | 22 | 13 | 10 | 12 | 15 | 17 |
| 12 | 17 | 20 | 17 | 13 | 11 | 14 | 16 |
| 10 | 19 | 21 | 11 | 7 | 9 | 6 | 8 |
| 9 | 17 | 19 | 12 | 8 | 7 | 2 | 5 |

A first matrix to be processed is presented in Table II.

TABLE II

First Matrix

| 14 | 18 | 22 | 13 |
|---|---|---|---|
| 12 | 17 | 20 | 17 |
| 10 | 19 | 21 | 11 |
| 9 | 17 | 19 | 12 |

In the second row and second column there is a current value of 17. A left delta computes 17−12=5. An above-left delta computes 17−14=3. An above delta computes 17−18=−1. An above-right delta computes 17−22=−5. Each of the sixteen current pixel positions are similarly computed to generate a left delta matrix, a left-above delta matrix, an above delta matrix, and a right-above delta matrix. A completed left delta matrix produces an evaluation measure=nil for the first matrix in Table II. The computation of a left-above delta matrix also produces an evaluation measure=nil.

An above delta matrix results in an evaluation measure=27, as in Table III.

TABLE III

Above Delta Matrix

| −1 | 2 | 3 | 0 |
|---|---|---|---|
| −2 | −1 | −2 | 4 |
| −2 | 2 | 1 | −6 |
| −1 | −2 | −2 | 1 |

A right-above delta matrix, as in Table IV, results in an evaluation measure=83.

TABLE IV

Right-Above Delta Matrix

| −2 | −1 | 9 | 5 |
|---|---|---|---|
| −6 | −5 | −7 | 7 |
| −7 | −1 | 4 | −2 |
| −10 | −4 | 8 | 5 |

Therefore, the evaluation measure comparison shows that the above delta (A) is best for the first 4×4 pixel matrix. A second matrix is represented in Table V.

TABLE V

Second Exemplary 4 × 4 Matrix

| 10 | 12 | 15 | 17 |
|---|---|---|---|
| 13 | 11 | 14 | 16 |
| 7 | 9 | 6 | 8 |
| 8 | 7 | 2 | 5 |

A left delta matrix of such second matrix, as in Table VI, results in evaluation measure=38.

TABLE VI

Left Delta Matrix

| −3 | −2 | 3 | 2 |
|---|---|---|---|
| −4 | −2 | 3 | 2 |
| −4 | 2 | −3 | 2 |
| −4 | −1 | −5 | 3 |

A left above delta matrix results in an evaluation measure=59.

TABLE VII

Left Above Delta Matrix

| −3 | 4 | 6 | 5 |
|---|---|---|---|
| 0 | 1 | 2 | 1 |
| −10 | −4 | −5 | −6 |
| −3 | 0 | −7 | −1 |

An above delta matrix results in an evaluation measure=51.

TABLE VIII

Above Delta Matrix

| 2 | 3 | 3 | 3 |
|---|---|---|---|
| 3 | −1 | −1 | −1 |
| −6 | −2 | −8 | −8 |
| 1 | −2 | −4 | −3 |

A right above delta matrix results in an evaluation measure=nil.

Therefore, the evaluation measure comparison shows that the left delta (L) is best for the second 4×4 pixel matrix. Pixel left delta of the first scan line is represented in Table IX.

TABLE IX

Pixel Left Delta Of The First Scan Line

| 15 | 1 | 3 | -6 | -5 | 1 | 3 | 2 |

Table X represents a result.

TABLE X

Result

| 15 | 1  | 3  | -6 | -5 | 1  | 3  | 2 |
|----|----|----|----|----|----|----|---|
| -1 | 2  | 3  | 0  | -3 | 2  | 3  | 2 |
| -2 | -1 | -2 | 4  | -4 | -2 | 3  | 2 |
| -2 | 2  | 1  | -6 | -4 | 2  | -3 | 2 |
| -1 | -2 | -2 | 1  | -4 | -1 | -5 | 3 |

Neighbor matrix markers are:

| A | L |

Huffman compression processing results in the Huffman tree of Table XI.

TABLE XI

Huffman tree

| pixel value | Huffman code | # of occurrences | total bits |
|---|---|---|---|
| 0  | 00010 | 1 | 5 |
| 1  | 010   | 4 | 12 |
| -1 | 0110  | 4 | 16 |
| 2  | 11    | 8 | 16 |
| -2 | 100   | 6 | 18 |
| 3  | 101   | 6 | 18 |
| -3 | 0111  | 2 | 8 |
| 4  | 00001 | 1 | 5 |
| -4 | 0011  | 3 | 12 |
| -5 | 0010  | 2 | 8 |
| -6 | 00011 | 2 | 10 |
| 15 | 00000 | 1 | 5 |
| Total |    | 40 | 133 |

The compression ratio for this example is (200−133)/200=34%

In general, method embodiments of the invention compare the pixel value differences with the neighboring pixels and replace the pixel values with the smallest of the several differences. A marker is attached to a block of pixels, such that all the pixels in that block are compared with neighbors of one direction. The marker indicates how all the pixels in that block are compared.

Periodic Huffman tree construction is used. Huffman coding is used to compress the resulting frame. A single Huffman tree is constructed once every q number of frames. Since the frames do not change frequently, q can be set to thirty and still not cause much deterioration in compression ratio. When used for real-time video compression, the frequency of Huffman tree construction is selected according to the instantaneous availability of processor time to perform the construction. When more processing time is available, the Huffman trees are computed more frequently. The frequency variation is implemented by first checking the input video frame buffer. If the frame buffer is empty, then processor time for Huffman tree construction is available.

Lossless compression of images has been implemented using the fact that color and brightness of the images change gradually on the surface so the values of neighboring pixels do not change drastically. In other words, each pixel is constrained by its neighboring pixels because the image data is not completely arbitrary.

Many compression methods are based on differential pulse code modulation (DPCM), which creates a "predictor" from some linear function of the pixels preceding a point in a scan line. The actual pixel value is replaced with a difference between the actual pixel value and the predictor. The predictor often equals the value of the immediately preceding pixel. In this way, the whole pixel values of the images are close to zero, and can be compressed either by using fewer bits to represent pixels or using Huffman coding to compress.

If each pixel were assigned its own marker, the total amount of data needed for such markers can be substantial, e.g., one quarter of the total. This overhead can be significantly reduced by dividing the image into a number of small n-by-m blocks. All the pixels in a block are assigned one marker. The one marker is attached to each block that indicates which of the four comparisons is selected. All the pixels in each block are compared with their neighboring pixels in a single way.

The shape and size of the block can take any form. In one embodiment of the invention, the n-by-m block dimension is set to be a four-by-four square matrix.

After all of the absolute pixel values have been preprocessed and reduced to small-numeric differential values, Huffman coding is used to compress the frame. But the Huffman coding of video can be time-expensive. Huffman coding consists of two phases, one to create the Huffman tree for encoding, and a next to encode the pixels. The first phase Huffman tree-generation processing time can require as much as the second phase time needed to encode the whole image. In order to reduce the time the invention performs tree generation once for several frames. Since the images do not change drastically between sequential frames, this often does not degrade the compression ratio.

Two different schemes can be used to set the frequency of Huffman tree generation, one fixed and one variable. A fixed number of frames can be made to share a single Huffman tree, e.g., thirty frames. The variable method generates Huffman trees according to the processor power available at the time. The availability of processing power is assessed by looking at the number of entries in an input buffer that need to be compressed. Little or no work to do means more time can be spent on generating Huffman trees more frequently.

A Huffman tree is used to convert each code in the input video stream into a Huffman code. The Huffman code is a variable length code that is short in length for frequently occurring input codes and longer for less frequently occurring input codes.

A particular Huffman code tree is considered more efficient than other Huffman code trees if it can produce a smaller output file. A very efficient Huffman code tree can be created if the statistical distribution of the input video is known. However, the distribution of the code in the entire video for a real time compression system cannot be estimated. One approach is to use a predetermined Huffman code tree, which works satisfactorily for most input files. But this approach may fail badly for some special cases. The optimal approach is to create a Huffman code tree for each frame but this consumes too much computation time.

The invention assumes the nature of the video, i.e., that the content of frames do not change very frequently. The invention takes a statistical distribution of codes for the first several frames, then creates a Huffman code tree. The Huffman code tree can be applied to the entire input video, but again this may work badly for some other parts of the video. Instead, the invention creates a Huffman code tree from the first several (scanned) frames, e.g., three frames, then applies this Huffman code tree to convert a set of (coded) frames, e.g., 20. Using this method, the lengthy time required for the Huffman code tree generation can be averaged over a long period of time to the point of being an insignificant load for computation.

Figure 3:
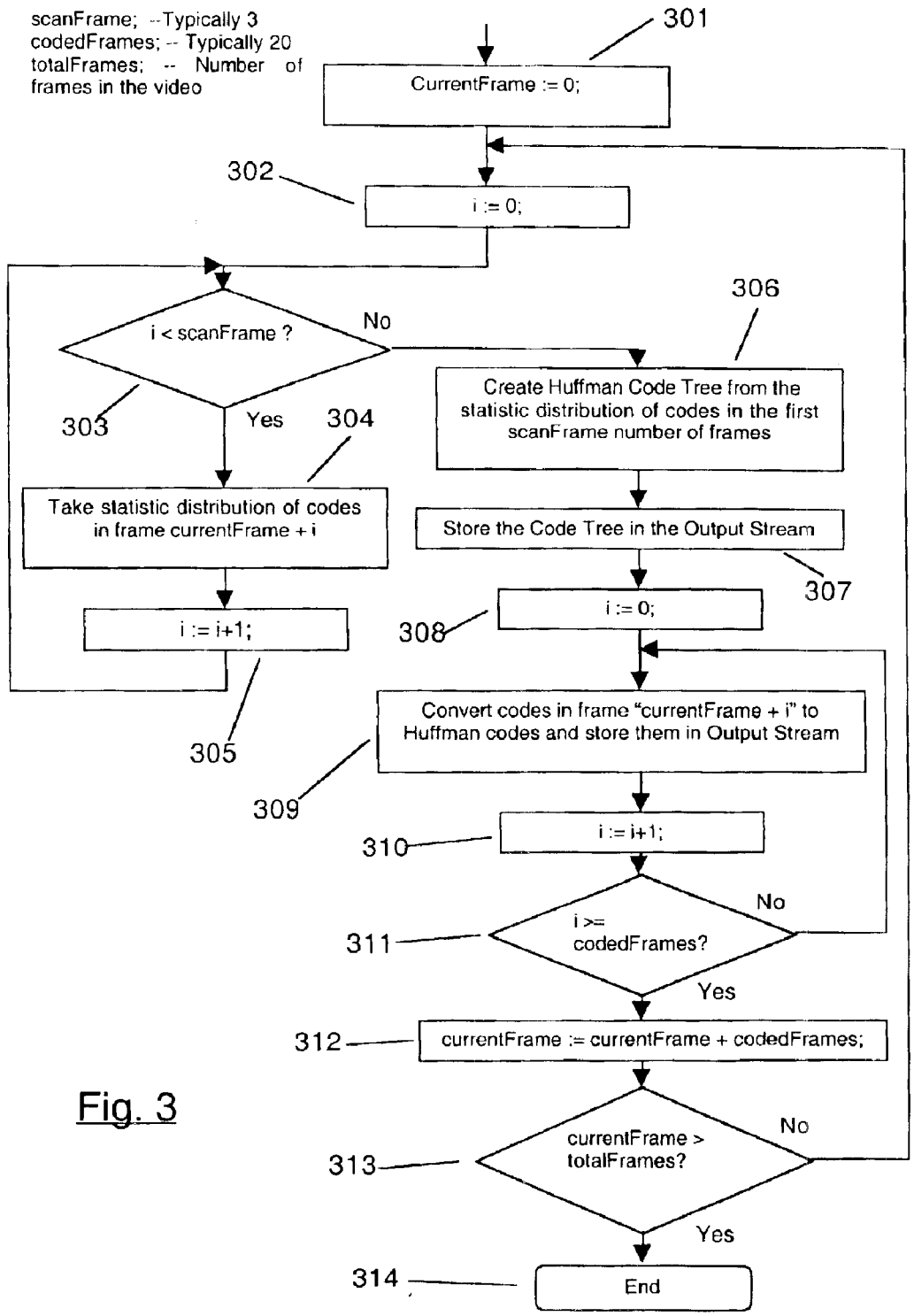
FIG. 3 is a block schematic diagram of a flowchart for the coding of frames of an input video stream by creating a Huffman tree using a statistical distribution from a series of frames and applying the Huffman tree to a longer series of frames according to the invention.

Referring to FIG. 3, the invention keeps the two numbers (scanned and coded) constant for the entire file or it can change the number of frames to apply the Huffman code tree to. The invention uses a counter to count the number of frames that are coded 301. The invention first goes through the scanning process where a scanFrame number of frames are scanned and a statistical distribution is performed on the codes in the frames 302, 303, 304, 305. ScanFrame is three in this example.

A Huffman tree is created using the statistical distribution of the scanned frames 306. The Huffman tree is then stored in the output stream so it can be retrieved during the decompression stage 307. The invention uses the Huffman tree to convert the codes in the set of codedFrames that includes the scanned set of frames and stores the resultant Huffman codes in the output stream 308, 309, 310, 311. CodedFrames in this example is equal to 20.

Figure 4:
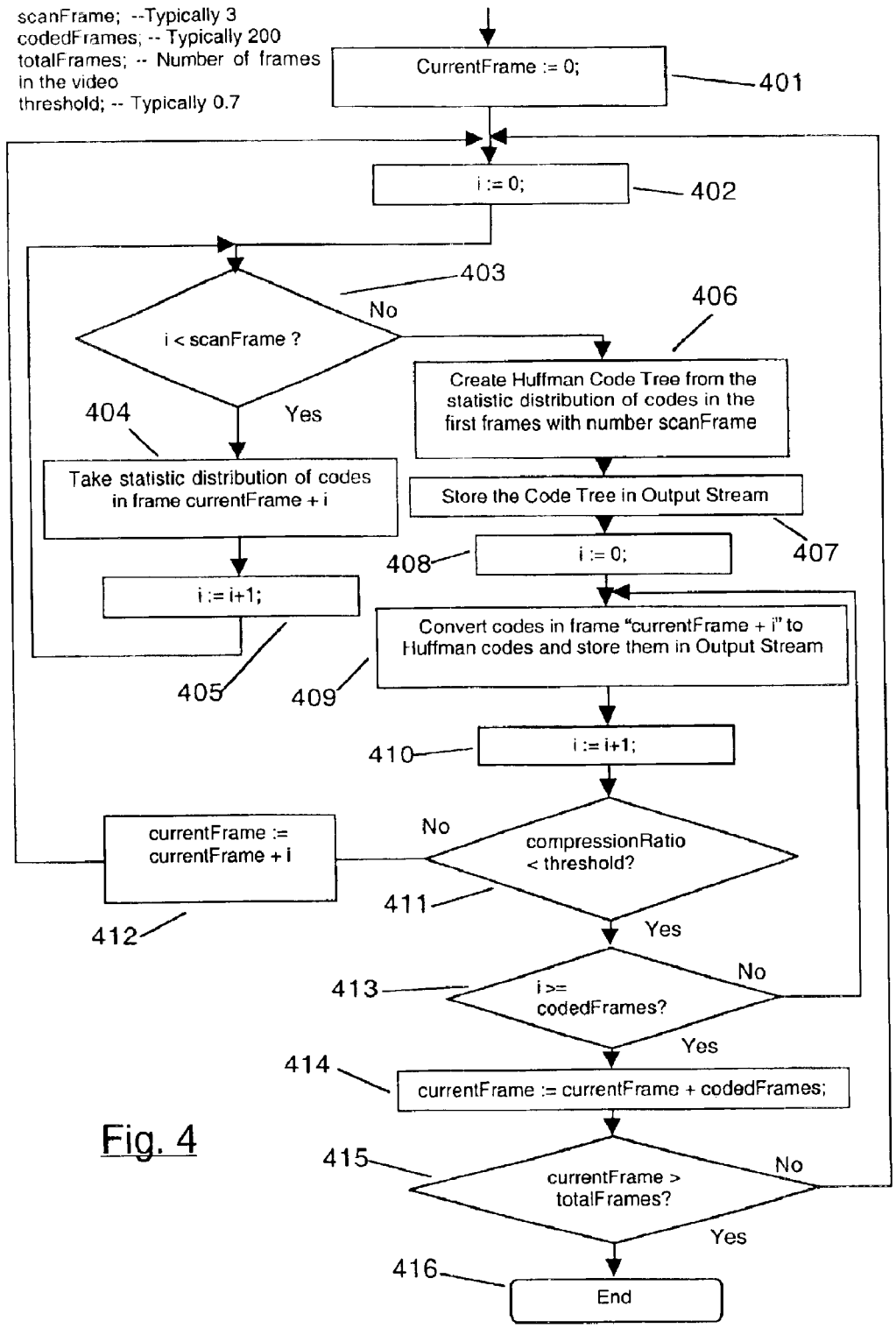
FIG. 4 is a block schematic diagram of a flowchart for the coding of frames of an input video stream by creating a Huffman tree using a statistical distribution from a series of frames, applying the Huffman tree to a longer series of frames, and creating another Huffman tree when the compression ratio falls below a certain threshold according to the invention.

The invention repeats this process for all of the frames in the video (totalFrames) 312, 313 until the all of the frames in the video are converted 314. Referring to FIG. 4, if the compression ratio becomes low, it may be because the scene has changed and the statistics of the codes in the frames have become very different. The invention recreates the code tree when this occurs. As in FIG. 3, the invention uses a counter to count the number of frames that are coded 401. The invention goes through the scanning process where a scanFrame number of frames are scanned and a statistical distribution is performed on the codes in the frames 402, 403, 404, 405. ScanFrame is three in this example.

A Huffman tree is created using the statistical distribution of the scanned frames 406. The Huffman tree is then stored in the output stream so it can be retrieved during the decompression stage 407. The invention uses the Huffman tree to convert the codes in the set of codedFrames that includes the scanned set of frames and stores the resultant Huffman codes in the output stream 408, 409, 410, 411, 413. CodedFrames in this example is equal to 200.

If the compression ratio of a frame falls below a threshold value (typically 0.7), indicating that a scene most likely has changed, the invention sets the currentFrame at the next frame 412 and goes back to the scanning process 402, 403, 404, 405, to create a new Huffman tree 406, 407.

The invention repeats this process for all of the frames in the video (totalFrames) 414, 415 until the all of the frames in the video are converted 416.

The Huffman code is encoded using a look up table for fast encoding. However, since the Huffman algorithm converts a short code to a variable length code, there are some codes that can be very long. Typically, if the input code is eight bits in length, the maximum length of the Huffman code generated is about 30-bits. Encoding is implemented by the invention in a relatively straight forward way using a lookup table of 256 entries for an eight-bit input code as exemplified in Table XII.

TABLE XII

Huffman code encoding table with 256 entries

| Number of bits in the output code | Code (in binary) |
|---|---|
| 2 | 00 |
| 2 | 01 |
| 4 | 1000 |
| ... | ... |
| ... | ... |
| ... | ... |
| ... | ... |
| 30 | 100111111 ... |

Decoding, on the other hand, is more complicated and time consuming because it is not possible to implement a look up table for long codes. If the maximum Huffman code length is 30-bits, then a table must be created with one billion entries—which is not feasible even in a modern day computer main memory.

Most Huffman decoding splits the code into two parts in order to fit in main memory and also to run faster. The two parts are: fixed length prefix; and variable length remainder. The invention uses the fixed length prefix as an index to a look up table as exemplified in Table XIII.

Given a modern day computer with several levels of memory hierarchy, it is desirable to fit the look up table in the fastest memory called the cache memory. The typical personal computer has 256 K bytes of cache memory, which means that the invention can use the prefix of size 11 bits (this can change as computers advance and larger cache sizes become more common). Many codes fit into 11 bits because of the nature of Huffman coding, that is, more frequently occurring input codes are assigned shorter output codes.

TABLE XIII

Huffman code decoding table with 2048 entries

| Number of bits in the code | Output code or Pointer to Search Table |
|---|---|
| 7 | 01111111 |
| 11 | 00111111 |
| 13 | Pointer to → Search table A |
| 15 | Pointer to → Search table B |
| ... | |
| ... | |
| ... | |
| ... | |
| 2 | 00001111 |

However, if the code does not fit into 11 bits, the rest of the codes are left in the remainder part. The typical way to handle the conversion of the remainder part is to use a search table. The first look up table's entry will point to another table if the output code that starts with the particular prefix is longer than 11 bits. In this overflow table as exemplified in Table XIV, entries are pairs of numbers, the remainder and the target code. If the first lookup table indicates that the code is longer than 11 bits, then the overflow table is searched with the remainder as a comparison index (or associative look up). If there is a matching entry, then the corresponding target code is output. This is, however, tremendously time consuming. So typically a hash table is used to speed up the search.

TABLE XIV

Overflow Search Table A

| Number of bits in the Remainder | Remainder | Output code |
| --- | --- | --- |
| 2 | 01 | 10010001 |
| 9 | 010101010 | 10010010 |
| 6 | 101010f | 10010011 |
| ... | | |
| ... | | |
| 5 | 11100 | 10010000 |

Even a hash table is slow, requiring several look ups. So it is not suited for the invention's purpose. Instead, the invention uses a concatenated code. When generating a Huffman code, if the output is longer than 11 bits, then the result will be a 19 bit code created by concatenating the 11 bit prefix and the eight bit input code. A decoding table entry will be either the length of the prefix and eight bit output code if the prefix is shorter than or equal to 11 bits, or an indicator saying that the code is longer than 11 bits. A decoding table is exemplified in Table XV.

TABLE XV decodeTable for concatenated code with 2048 entries

| Field numBits (Number of bits in the code) | Field outputCode (Output code) |
| --- | --- |
| 2 | 00001111 |
| 4 | 00110011 |
| 19 | N/A |
| 19 | N/A |
| 11 | 01010101 |
| ... | ... |

Figure 5:
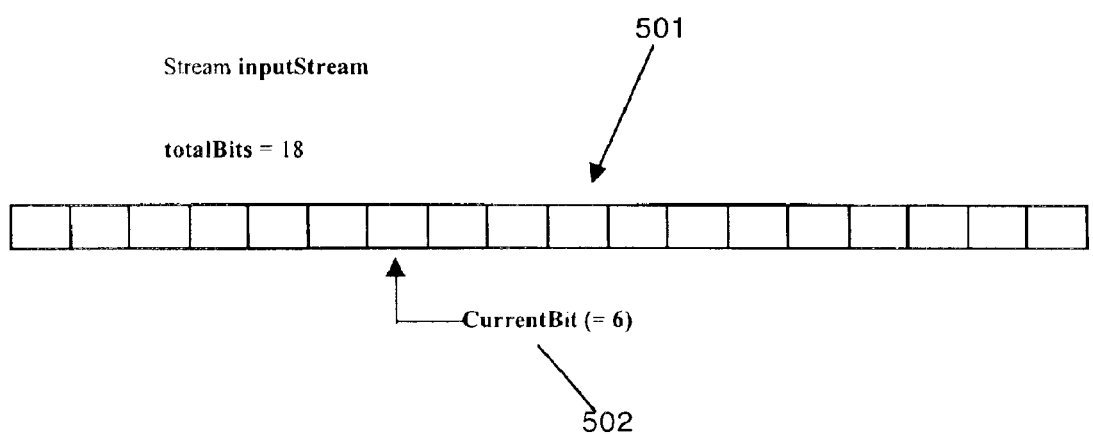
FIG. 5 is a block schematic diagram of an input stream and a current bit pointer according to the invention.
Figure 6:
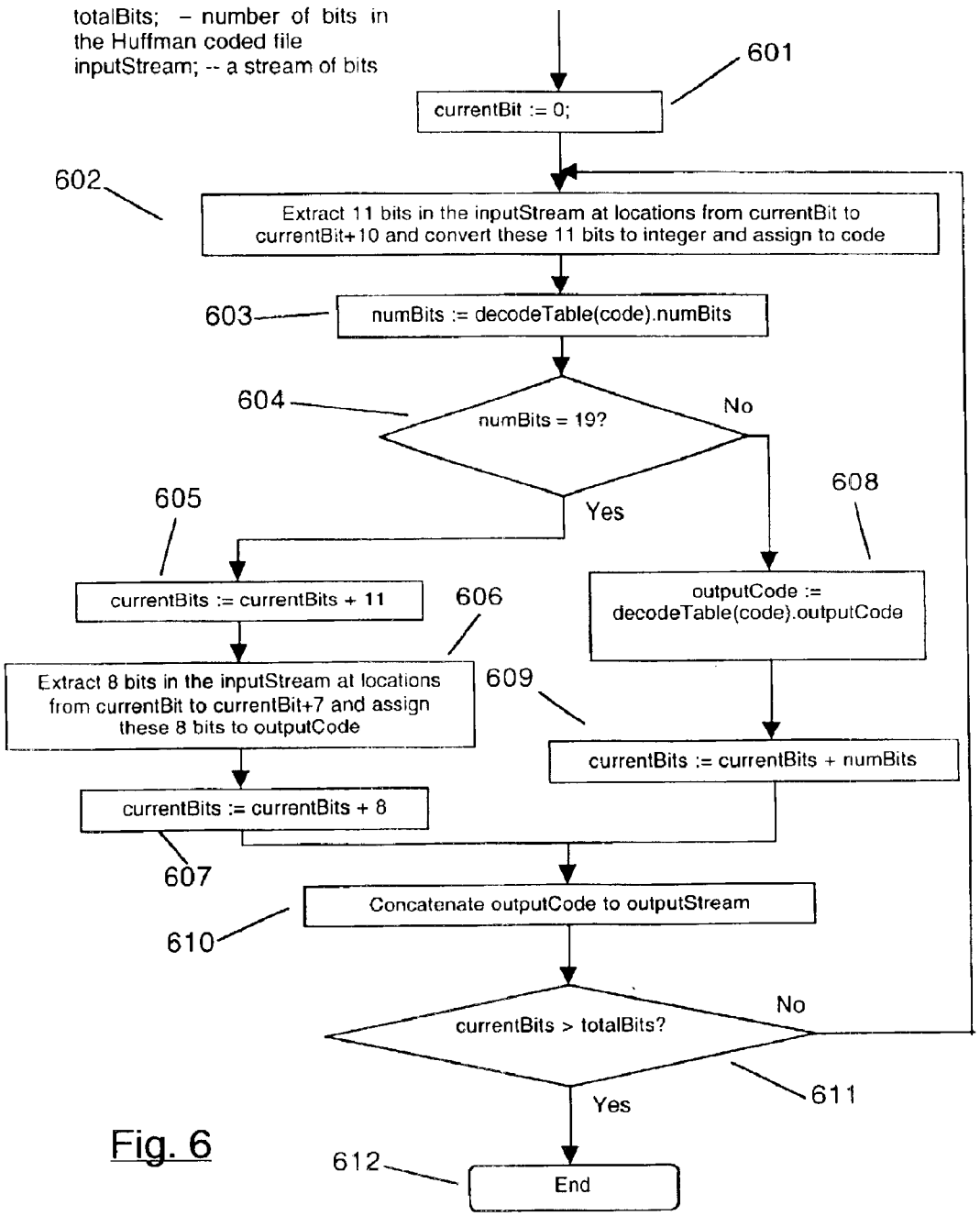
FIG. 6 is a block schematic diagram of a flowchart for the decoding of frames of an input stream using a concatenated code approach and a decode table according to the invention.

With respect to FIGS. 5 and 6, the invention's concatenated code Huffman decoding method is shown. The invention processes the input stream 501 by walking through the stream using a currentBit pointer 502, 601. A code is calculated from the input stream 501 using the currentBit and the following ten bits 602. The decodeTable, as shown in Table XV, is used to look up the calculated code to find the number of bits in the code 603.

If the number of bits is 19, then the invention takes the eight bit input code by indexing into the input stream and appends the code to the output stream 605, 606, 607, 610. If the number of bits is not 19, then the invention takes the output code from the decodeTable and appends the output code to the output stream 608, 609, 610.

The process is repeated 611 until the bits in the input stream 501 are consumed 612

Figure 7:
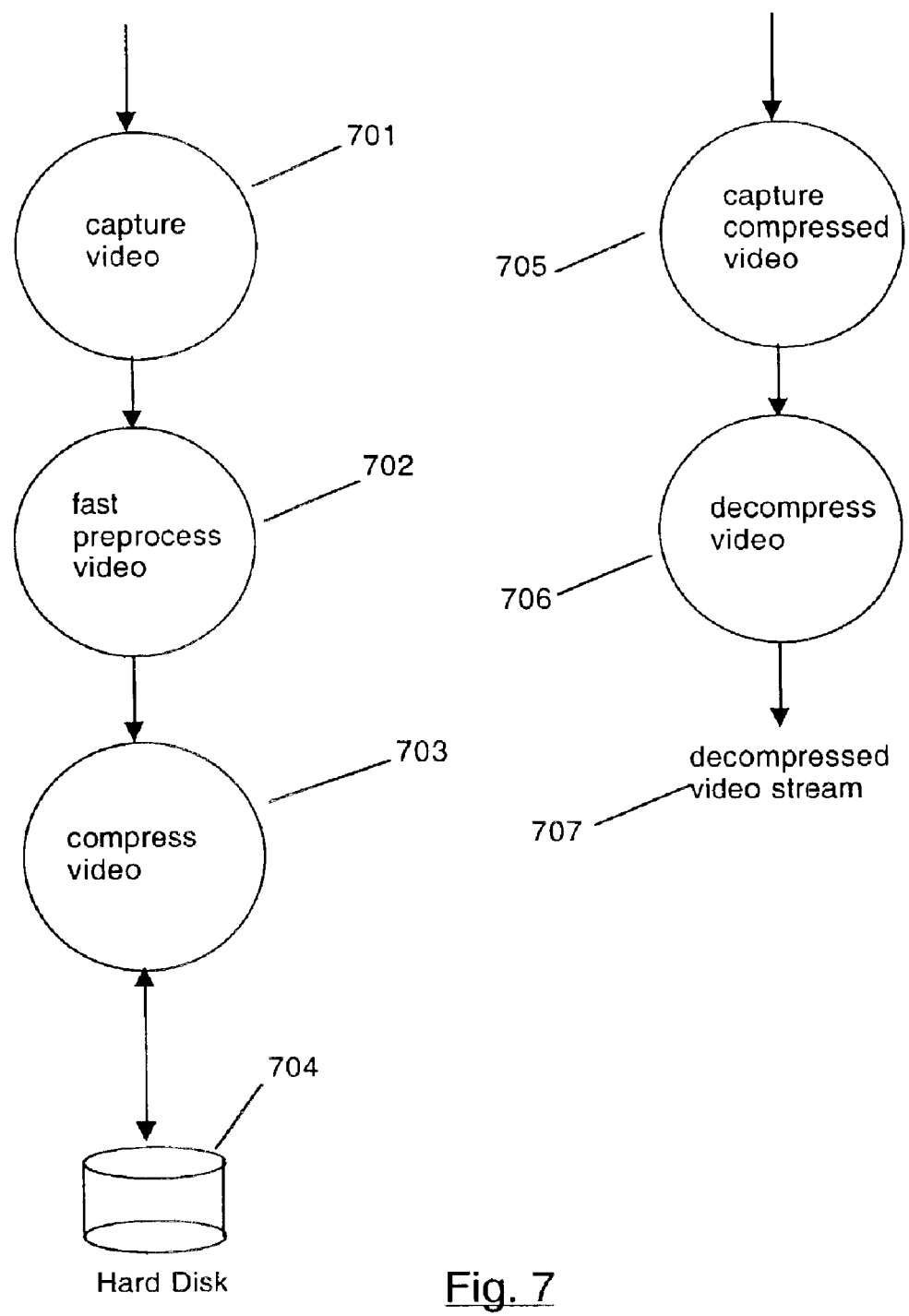
FIG. 7 is a block schematic diagram of a task viewpoint of the invention showing the invention's compression and decompression stages according to the invention.

Referring to FIG. 7, a task viewpoint of the invention is shown. On the compression side, the capture video task 701 captures the video stream that is to be compressed. The video stream is fed to the fast preprocess video task 702 which preprocesses the video as described above and in FIGS. 1 and 2. As the frames in the video are preprocessed, they are passed to the compress video task 703 which compresses the video as described above and in FIGS. 4 and 5. The compress video task 703 stores the Huffman trees used in the compressed output stream and stores the output stream on the hard disk 704.

On the decompression side, when a compressed video stream is sent to be decompressed, the capture compressed video task 705 captures the input stream. The input stream is passed from the capture compressed video task 705 to the decompress video task 706. The decompress video task 706 decompresses the input stream as described above and in FIG. 6 and outputs the decompressed video stream 707.

When the frame size of a video is large or the frame rate is high, the data rate of the video can be very large, and sometimes the CPU is not powerful enough to compress and decompress every frame. In such a case, the invention does not compress frames for a predetermined period so the CPU can keep up with the video data that is coming in.

There are two approaches to selective compression. One approach is to compress at a regular frequency. For example, the invention can compress every other frame, or it can compress two frames and not do anything about the third frame and then compress two more frames.

Figure 8:
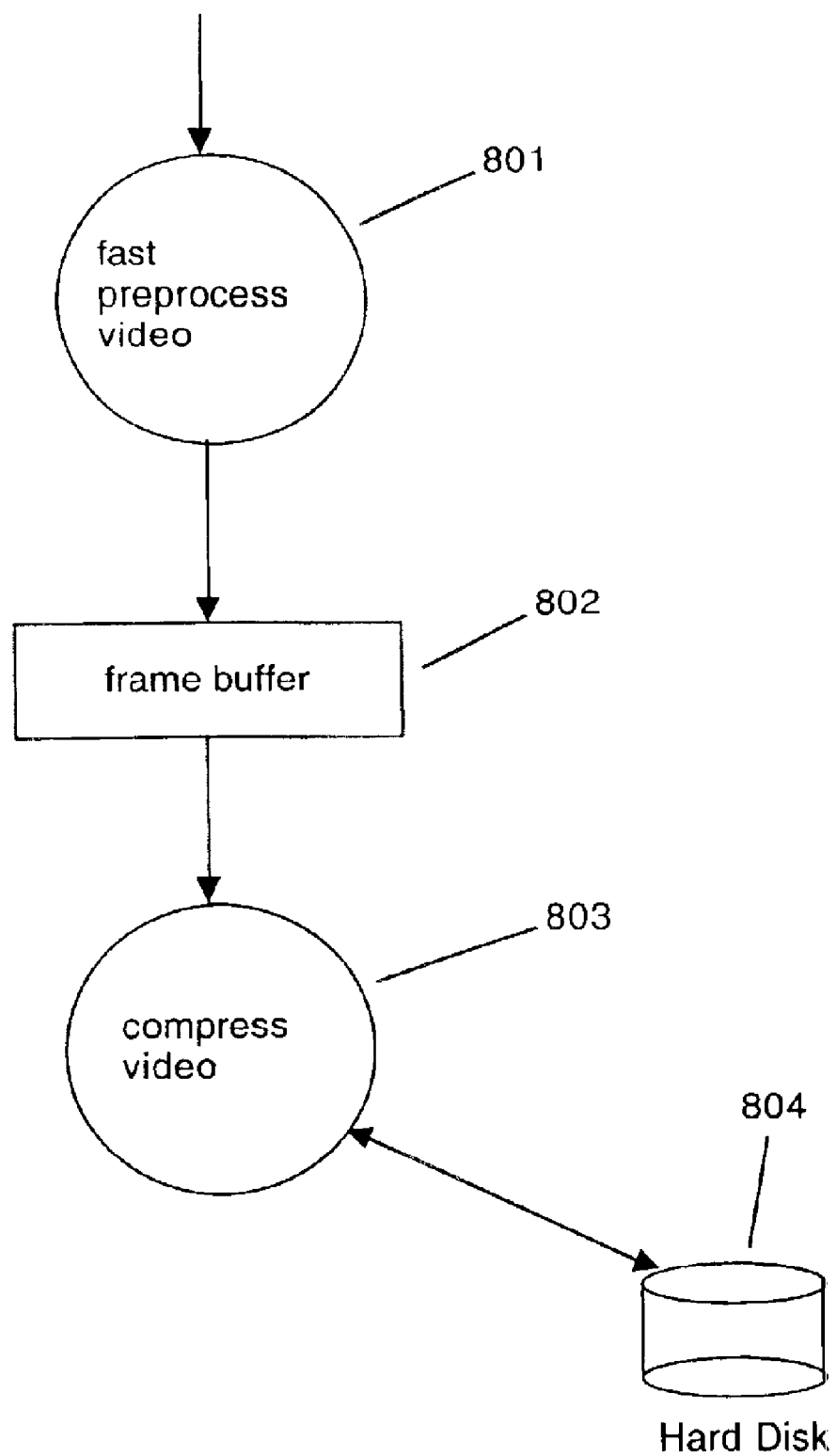
FIG. 8 is a block schematic diagram of a selective compression scheme according to the invention.

With respect to FIG. 8, another approach that the invention uses is an adaptable system. The invention compresses frames when there are enough CPU resources left. The invention measures the CPU availability by maintaining a buffer of incoming frames 802. This buffer 802 is placed between the fast preprocess video task 801 and compress video task 803. If the number of frames in the buffer 802 becomes greater than a threshold, e.g., five, then the compress video task 803 skips compressing frames and immediately writes the frames in the buffer 802 to the disk 804. Once the buffer size becomes zero, or less than a second threshold value, then the compress video task 803 starts compressing frames again.

Although the invention is preferably described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A process for compressing and decompressing a video stream, comprising the steps of:

providing fast preprocessing means for preprocessing video frames in the video stream using a best-neighbor algorithm;

compressing the video frames using Huffman coding;

wherein a single level Huffman code tree is created as the video frames are being received by said compressing step; and wherein said compressing step outputs a compressed video stream.

2. The process of claim 1, wherein said compressing step further comprises the step of:

providing statistical distribution calculation means for scanning a first number of frames in a set of frames and performing a statistical distribution on the codes in the first number of frames.

3. The process of claim 2, wherein said compressing step further comprises the steps of:

creating a Huffman tree using the statistical distribution of the scanned frames;

converting the codes in the set of frames using the Huffman tree;

storing the resultant Huffman codes in the compressed video stream; and repeating said creating, converting, and storing steps for all of the video frames in the video stream.

4. The process of claim 3, wherein said Huffman tree creating step stores the Huffman tree in the compressed video stream.

5. The process of claim 2, wherein if the compression ratio of a frame falls below a threshold value, then said compression step goes back to said statistical distribution calculation means to create a new Huffman tree.

6. The process of claim 1, wherein said compression step compresses video frames at a regular frequency.

7. The process of claim 1, wherein said compression step compresses frames when there are enough CPU resources available, wherein said compression step measures the CPU availability by maintaining a buffer of incoming frames, and wherein if a number of frames in the buffer becomes greater than a predetermined threshold value, then said compression step skips compressing frames and immediately writes the incoming frames in the buffer to the output stream until the number of frames in the buffer becomes less than a second predetermined threshold value.

8. The process of claim 1, further comprising the steps of:
receiving a compressed video stream;
extracting a code from a set of bits in the compressed video stream;
providing a decode table to look up the extracted code to find a length of bits in a code;
looking up the length of bits for said extracted code in said decode table;
wherein if the length of bits is equal to a predetermined value, then extracting an input code from the compressed stream and appending the input code to an uncompressed video stream;
wherein if the length of bits is not equal to a predetermined value, then looking up an output code from said decode table and appending the output code to the uncompressed video stream; and
repeating said extracting and looking up modules until all of the bits in the compressed video stream are consumed.

9. An apparatus for compressing and decompressing a video stream, comprising:
fast preprocessing means for preprocessing video frames in the video stream using a best-neighbor algorithm;
a module for compressing the video frames using Huffman coding;
wherein a single level Huffman code tree is created as the video frames are being received by said compressing module; and
wherein said compressing module outputs a compressed video stream.

10. The apparatus of claim 9, wherein said compressing module further comprises:
statistical distribution calculation means for scanning a first number of frames in a set of frames and performing a statistical distribution on the codes in the first number of frames.

11. The apparatus of claim 10, wherein said compressing module further comprises:
a module for creating a Huffman tree using the statistical distribution of the scanned frames;
a module for converting the codes in the set of frames using the Huffman tree;
a module for storing the resultant Huffman codes in the compressed video stream; and
a module for repeating said creating, converting, and storing modules for all of the video frames in the video stream.

12. The apparatus of claim 11, wherein said Huffman tree creating module stores the Huffman tree in the compressed video stream.

13. The apparatus of claim 10, wherein if the compression ratio of a frame falls below a threshold value, then said compression module goes back to said statistical distribution calculation means to create a new Huffman tree.

14. The apparatus of claim 9, wherein said compression module compresses video frames at a regular frequency.

15. The apparatus of claim 9, wherein said compression module compresses frames when there are enough CPU resources available, wherein said compression module measures the CPU availability by maintaining a buffer of incoming frames, and wherein if a number of frames in the buffer becomes greater than a predetermined threshold value, then said compression module skips compressing frames and immediately writes the incoming frames in the buffer to the output stream until the number of frames in the buffer becomes less than a second predetermined threshold value.

16. The apparatus of claim 9, further comprising:
a module for receiving a compressed video stream;
a module for extracting a code from a set of bits in the compressed video stream;
a decode table to look up the extracted code to find a length of bits in a code;
a module for looking up the length of bits for said extracted code in said decode table;
wherein if the length of bits is equal to a predetermined value, then extracting an input code from the compressed stream and appending the input code to an uncompressed video stream;
wherein if the length of bits is not equal to a predetermined value, then looking up an output code from said decode table and appending the output code to the uncompressed video stream; and
a module for repeating said extracting and looking up modules until all of the bits in the compressed video stream are consumed.

* * * * *